United States Patent [19]
Rastgar et al.

[11] Patent Number: 5,369,643
[45] Date of Patent: Nov. 29, 1994

[54] METHOD AND APPARATUS FOR MAPPING TEST SIGNALS OF AN INTEGRATED CIRCUIT

[75] Inventors: Farid Rastgar, San Jose; Sung-Soo Cho, Sunnyvale; Diane Bryant; Nikhil Mazumder, both of San Jose, all of Calif.

[73] Assignee: Intel Corporation, Santa Clara, Calif.

[21] Appl. No.: 10,422

[22] Filed: Jan. 28, 1993

Related U.S. Application Data

[63] Continuation of Ser. No. 853,890, Mar. 19, 1992, abandoned, which is a continuation of Ser. No. 596,229, Oct. 12, 1990, abandoned.

[51] Int. Cl.$^5$ .................. G01R 31/28; G06F 11/00; H04B 17/00
[52] U.S. Cl. .................. 371/15.1; 371/22.1
[58] Field of Search .............. 371/15.1, 22.1, 22.5, 371/27; 324/158 R, 22.6

[56] References Cited

U.S. PATENT DOCUMENTS

| | | | |
|---|---|---|---|
| 4,752,729 | 1/1988 | Jackson et al. | 371/22.1 |
| 4,905,240 | 2/1990 | Kimoto | 371/22.1 |
| 4,926,363 | 5/1990 | Nix | 371/27 |
| 5,030,904 | 7/1991 | Tanksalvala et al. | 371/22.5 |

*Primary Examiner*—Robert W. Beausoliel, Jr.
*Assistant Examiner*—Trinh Tu
*Attorney, Agent, or Firm*—Blakely, Sokoloff, Taylor & Zafman

[57] ABSTRACT

In an integrated circuit comprising discrete circuit modules, dedicated test signals for the individual circuit modules are multiplexed with operational signals to the external pins of the integrated circuit. When not in a test mode, the external pins of the chip are coupled to the normal operational signals. When a test mode is commanded, certain external pins are coupled to test signals that are not otherwise available off-chip in accordance with the contents of a test register.

8 Claims, 2 Drawing Sheets

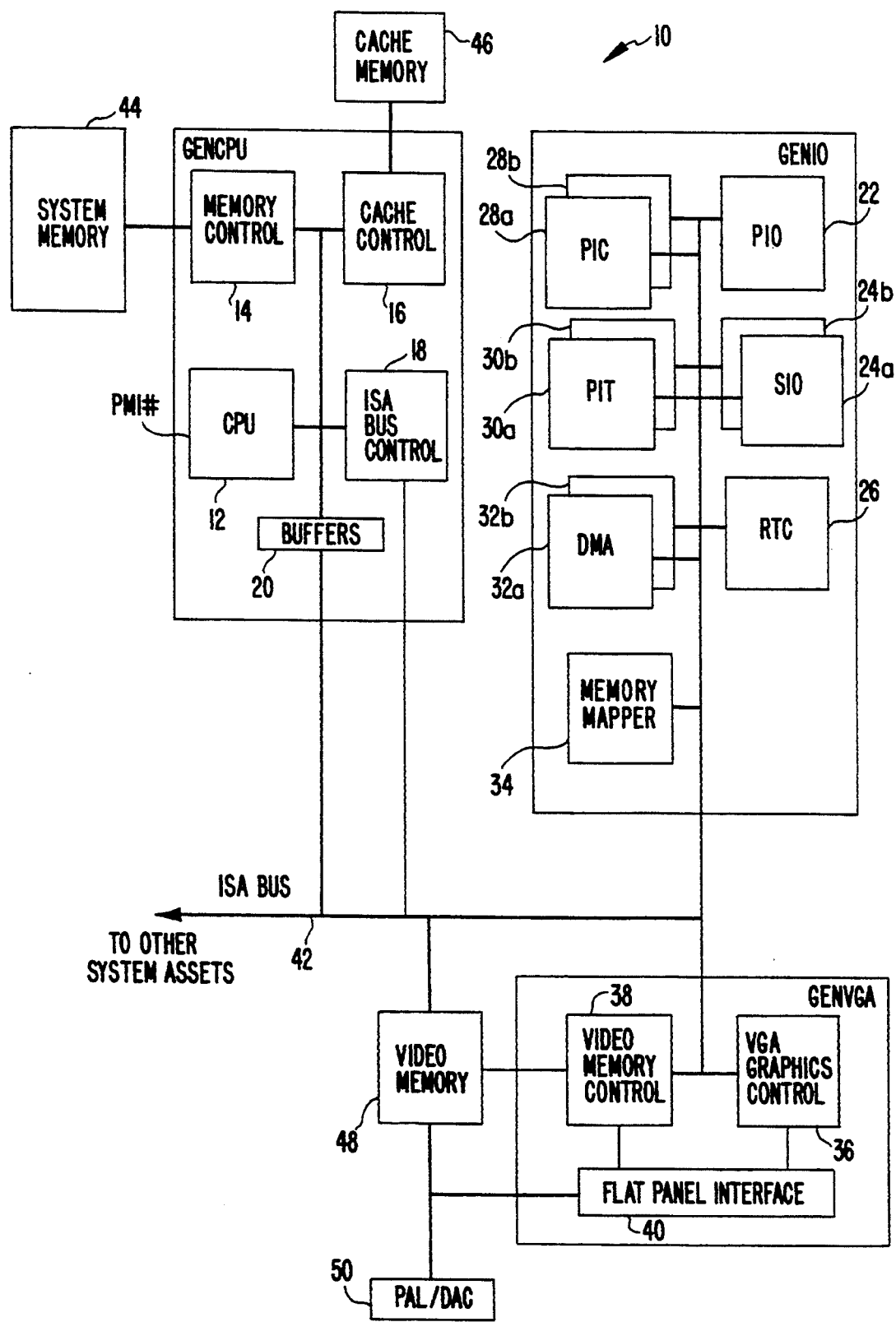
F I G. 1

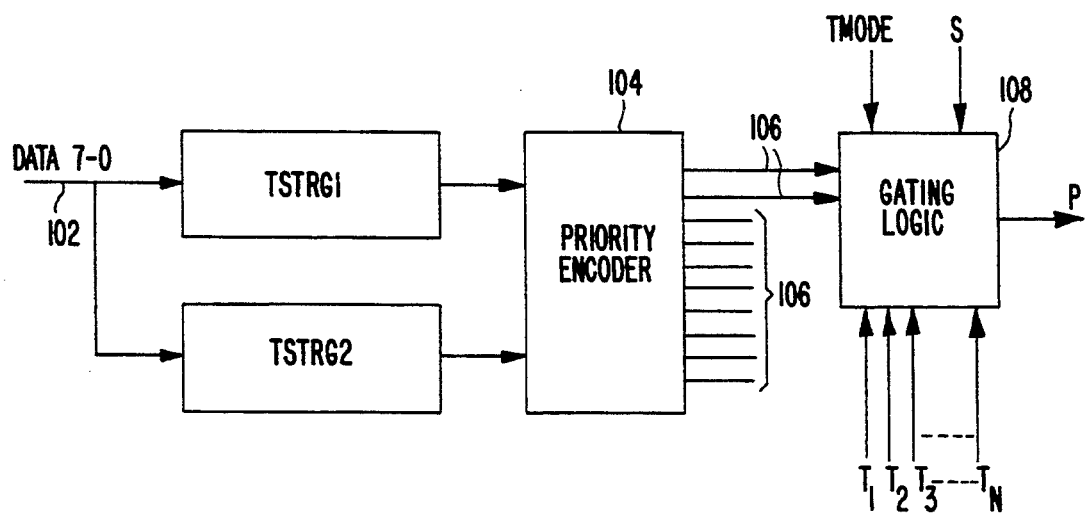
F I G. 2

5,369,643

METHOD AND APPARATUS FOR MAPPING TEST SIGNALS OF AN INTEGRATED CIRCUIT

This is a continuation of application Ser. No. 07/853,890, filed Mar. 19, 1992, now abandoned, which is a continuation of Ser. No. 07/596,229 filed Oct. 12, 1990, now abandoned.

FIELD OF THE INVENTION

This invention relates to the field of integrated circuit testing, and particularly to a method and apparatus for testing modules of integrated circuits whose signals are not normally accessible off-chip.

BACKGROUND OF THE INVENTION

As the complexity of integrated circuits increases, it becomes increasingly difficult to comprehensively test the performance of such circuits. These circuits are normally subjected to automated test procedures whereby various combinations of input signals are applied to the chip and output signals are monitored for expected results. To exhaustively test a complex integrated circuit, numerous combinations of input signals or test vectors are required.

Integrated circuits that comprise numerous circuit modules, such as may be created using cell based design, will have numerous module pin signals which would make the pin count for the circuit prohibitively large. Thus, it may not be practical to bring all such signals off chip. Furthermore, integrated circuits have numerous signals that are not accessible off-chip and it may not be possible to exercise all internal states of the circuit using input-to-output test techniques of the prior art.

An alternative approach is to mechanically probe the signal traces on the circuit chip. However, such a technique is impractical outside of a laboratory and could not be utilized for production quantities of integrated circuits.

A primary objective of the present invention is to provide a means for gaining access to internal signals of an integrated circuit for test purposes.

It is another objective of the present invention to gain such test access to internal signals without increasing the pin-outs of the integrated circuit chip.

SUMMARY OF THE INVENTION

The present invention provides a means for mapping circuit module test signals to the pin-outs of an integrated circuit chip when in a test mode. When not in a test mode, the pin-outs are assigned to the normal operational functions of the chip.

Test selection information is provided on a data bus to a test register. The contents of the test register are applied to a priority encoder which provides a plurality of test selection signals according to the particular test configuration identified by the contents of the test register. The test selection signals are applied to the test mode control inputs of the circuit modules and are also applied to gating logic associated with certain of the external pins of the integrated circuit. The gating logic associated with a particular external pin receives a plurality of test signals and an operational signal normally associated with that pin. When the integrated circuit is in its normal operational mode, the operational signal is asserted at the external pin. When the circuit is placed in a test mode, the signal asserted at the pin is determined by the test selection signals. Various external pins in the integrated circuit are associated with one or more test functions so that the test accessibility of the circuit is substantially increased without increasing the number of pin-outs.

BRIEF DESCRIPTION OF THE DRAWINGS

FIG. 1 is a functional block diagram of a microprocessor system embodying the present invention.

FIG. 2 is a functional block diagram of the test selection function of the present invention.

DETAILED DESCRIPTION OF THE INVENTION

In the following description, for purposes of explanation and not limitation, specific circuits, pin assignments, etc. are set forth in order to provide a thorough understanding of the present invention. However, it will be apparent to one skilled in the art that the present invention may be practiced in other embodiments that depart from these specific details. In other instances, detailed descriptions of well known aspects of microprocessor systems and digital circuits are omitted so as to not obscure the description of the present invention with unnecessary detail.

System Overview

The present invention is advantageously employed in a microprocessor design optimized for applications requiring low power consumption and compact size. Such applications particularly include small personal computers of the types commonly referred to as laptops and notebooks. One embodiment of such a microprocessor is briefly described below; however, it is to be understood that the present invention is not limited to this particular microprocessor design, and may be incorporated in virtually any processor design.

Referring to FIG. 1, a processor system 10 is shown. System 10 comprises three main processor components, designated as GENCPU, GENIO and GENVGA. GENCPU is an expanded central processing unit including the CPU 12, a memory controller 14, a cache controller 16, ISA bus control logic 18 and line buffers 20.

In the described embodiment, CPU 12 is essentially a 386 ™ SX CPU manufactured by Intel Corporation, the corporate assignee of this invention. Throughout this description, certain terminology relating to the 386 ™ SX CPU, such as register names, signal nomenclature, etc., is employed to describe the present invention. Such terminology is understood by practitioners in the field of microprocessor design and will therefore not be explained at length herein. For further information relating to the internal structure of CPU 12, reference is made to the "386 ™ SX Microprocessor Hardware Reference Manual" published by Intel Corporation as publication number 240332 and related publications.

GENIO is a single chip input/output unit comprising parallel ports 22, dual serial ports 24a, 24b, real time clock unit 26, dual programmable interrupt controllers 28a, 28b, dual programmable timers 30a, 30b, dual DMA controllers 32a, 32band memory mapper 34.

GENVGA is a single chip graphics interface comprising VGA graphics controller 36, video memory controller 38 and interface 40 for a flat panel display unit.

All of the processor units communicate with one another and with other system components (such as expansion slots, keyboard controller, disk controllers, etc.) via ISA bus 42.

External to the three main components of system 10 are system memory 44, optional cache memory 46 and optional video memory 48. An optional PAL/DAC unit 50 provides a video interface with a conventional VGA monitor.

Test Mode Implementation

The GENIO chip combines a large number of circuit modules, each of which would likely be separately packaged in a prior art microprocessor system. When individually packaged, each circuit module has a large number of pin-outs, some of which are devoted to test functions. When combining these circuit modules onto a single integrated circuit chip, it is not practical to provide all of the same signals as pin-outs since the number of external pins would be prohibitively large. To address this problem, signals that would otherwise be pin-outs of each circuit module are mapped to the external pins of the GENIO chip in accordance with test selection signals.

FIG. 2 is a functional block diagram of the means by which this mapping function is accomplished. Test selection data is provided on 8-bit bus 102 to test registers TSTRG1 and TSTRG2. Bits 3–7 of TSTRG1 and bits 0–7 of TSTRG2 determine the selected test mode. These bits are asserted at priority encoder 104 which generates the appropriate module test selections signal 106.

Certain external pins of the GENIO chip are remapped from the normal operational function to a test function dependent upon the selected test mode. Each such pin P has associated gating logic 108 that receives certain of the test selection signals 106. Gating logic 108 receives the normal operational signal S associated with pin P and one or more test signals $T_1-T_N$ that are also associated with the same pin. An additional input to gating logic 108 is signal TMODE, which when in a high state places the GENIO chip into a test mode and when in a low state places the chip in its normal operational mode. When signal TMODE is low, the operational signal S is asserted at pin P. When signal TMODE is high, one of test signals $T_1-T_N$ is asserted at pin P depending upon the states of the test selection signals 106.

Referring back to FIG. 1, an example of the detailed implementation of the present invention will be provided in connection with master-slave DMA controller modules 32a, 32b of the GENIO chip. DMA controllers 32a, 32b are each functionally identical to the industry standard 82C37A programmable DMA controller. These circuit modules generate all of the same signals that are provided as pin-outs on the 82C37A chip, many of which are dedicated to test functions. Because of the large scale of integration of the GENIO chip, it is not practical to provide all of these same circuit module signals as pin-outs on the GENIO chip. Accordingly, certain of the pin-outs are remapped when in a test mode to perform certain of the test functions. Using conventional 82C37A signal terminology, the following table illustrates how test function signals of DMA modules 32a and 32b are mapped onto the external pins of the GENIO chip.

| GENIO PIN # | NORMAL FUNCTION | DMA TEST FUNCTION | INPUT/ OUTPUT |
|---|---|---|---|
| B140 | LPTD0 | TRESET | I |
| B162-1590 | LPTD7-4 | TTDRQ3-0 | I |
| B142 | PERR# | TDMACSB | I |
| B151 | LPTBUSY | TEOPIN | I |
| B150 | LPTACK# | TREADY | I |
| B153 | LPTSLCT | TDMACLK | I |
| B146 | LPTERROR# | THLDA | I |
| B60 | T/C# | TEOPOUT | O |
| B136 | DMA8/16# | TADSTB | O |
| B79,B44,B59,B42 | DACKO-3# | TDACKO-3# | O |
| B37 | AEN | TAEN | O |
| B80 | MEMR# | TMEMR# | O |
| B86 | MEMW# | TMEKW# | O |

Another example of the implementation of the present invention is provided with reference to timers 30a and 30b of FIG. 1. Each of these timers is functionally identical to the industry standard 82C54 Programmable Interval Timer. Using conventional 82C54 signal terminology, the following table illustrates how test function signals of timer modules 30a and 30b are mapped onto the external pins of the GENIO chip.

| GENIO PIN # | NORMAL FUNCTION | INTERVAL TIMER TEST FUNCTION | INPUT/ OUTPUT |
|---|---|---|---|
| B142 | PERR# | T54CSB | I |
| B146 | LPTERROR# | TGATE2 | I |
| B153 | LPTSLCT | TCLK2 | I |
| B151 | LPTBUSY | TGATE1 | I |
| B150 | LPTACK# | TCLK1 | I |
| B152 | LPTPE | TGATE0 | I |
| B162 | LPTD7 | TCLK0 | I |
| B174 | TIM2OUT2 | TOUT0 | O |
| B155 | LPTINIT# | TOUT1 | O |
| B143 | LPTSTROBE# | TOUT2 | O |

It will be observed that the external pins of the GENIO chip have a plurality of test functions, the selected function depending upon the particular test mode specified by the contents of test registers TSTRG1 and TSTRG2. For example, input pin B142 is assigned to signal TDMACSB when GENIO is in DMA test modes, but is assigned to signal T54CSB when GENIO is in interval timer test modes.

Apart from the obvious advantages of reducing the external pin count and improving testability of an integrated circuit, the present invention also results in a significant reduction in test time since test logic in the individual circuit modules, otherwise necessary for interfacing across a system bus, may be bypassed in the closely coupled environment of the present invention. Furthermore, the clock rate at which test commands are implemented may be significantly increased.

It should be noted that the present invention is not limited to multiplexing of dedicated test signals, but may also be employed to provide access to other internal signals of an integrated circuit that would not otherwise be accessible off-chip, such as interface signals between circuit modules.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. A method of testing an integrated circuit in a package having a plurality of external pins, said integrated circuit having a plurality of circuit modules, said method comprising the steps of:
   a) providing a test register within said integrated circuit;
   b) loading said test register with a test configuration control word;
   c) generating a test selection signal responsive to said test configuration control word;
   d) generating a test mode enable signal;
   e) providing a gating circuit having a first terminal coupled to one of said external pins, said gating circuit also having a first gating control input coupled to the test mode enable signal and a second gating control input coupled to the test selection signal, said gating circuit further having a second terminal coupled to an operational signal which is coupled to a first circuit module within the integrated circuit, said signal which is normally only mally associated with said one external pin and said gating circuit having a third terminal coupled to a signal that is normally only internal to said integrated circuit, said signal which normally only internal to said integrated circuit being coupled to a second circuit module within the integrated circuit, said first terminal being selectively coupled to one of said second and third terminals under control of the first and second gating control inputs;
   f) coupling the operational signal to said one external pin when the test mode enable signal is in a first state and selectively coupling the signal that is normally only internal to said integrated circuit to said one external pin in response to the test selection signal when the test mode enable signal is in a second state.

2. The method of claim 1 wherein said signal that is normally only internal to said integrated circuit is a dedicated test signal associated with said second circuit module.

3. The method of claim 1 wherein said signal that is normally only internal to said integrated circuit is an interface signal between said second circuit module and a third circuit module within said integrated circuit.

4. The method of claim 1 further comprising the step of applying an external test signal to said one external pin when said gating circuit has coupled said one external pin to said signal that is normally only internal to said integrated circuit.

5. The method of claim 1 wherein said gating circuit has a plurality of terminals coupled to a respective plurality of signals that are normally only internal to said integrated circuit, each of said plurality of signals being coupled to a respective one of a plurality of circuit modules and said gating circuit has a plurality of second gating control inputs coupled to a plurality of test configuration control signals and wherein, when said test mode control signal is in the second state, said one external pin of said integrated circuit is coupled to a selected one of the plurality of signals that are normally only internal to said integrated circuit as a function of a corresponding one of the plurality of test configuration control signals.

6. An improved integrated circuit in a package having a plurality of external pins, at least one pin having an operational signal coupled to a first circuit module normally associated therewith, said integrated circuit further having a second circuit module and a signal coupled thereto that is normally only internal to the integrated circuit, wherein the improvement comprises:

a) test register means for storing test configuration control data;
   b) priority encoder means operatively coupled to said test register means for receiving said test configuration control data and for generating a test selection signal;
   c) test mode control means for generating a test mode enable signal;
   d) gating logic means operatively coupled to said priority encoder means for receiving said test selection signal and to said test mode control means for receiving said test mode enable signal, said gating logic means further coupled to one of said plurality of external pins and said associated operational signal and still further coupled to said signal that is normally only internal to said integrated circuit, wherein said gating logic means couples said one external pin to said corresponding associated operational signal when the test mode enable signal is in a first state and selectively couples said signal that is normally only internal to said integrated circuit in response to the test selection signal when the test mode enable signal is in a second state.

7. The device of claim 6 wherein a plurality of signals that are normally only internal to said integrated circuit are coupled to said gating logic means and said gating logic means is responsive to said test selection signal to couple a selected one of said plurality of signals that are normally only internal to said integrated circuit to said one external pin when said test mode enable signal is in said second state.

8. A method of testing an integrated circuit in a package having a plurality of external pins, said integrated circuit having a plurality of circuit modules, said method comprising the steps of:
   a) providing a test register within said integrated circuit;
   b) loading said test register with a test configuration control word;
   c) generating a test selection signal responsive to said test configuration control word;
   d) generating a test mode enable signal;
   e) providing a gating circuit having a first terminal coupled to one of said external pins, said gating circuit also having a first gating control input coupled to the test mode enable signal and a second gating control input coupled to the test selection signal, said gating circuit further having a second terminal coupled to an operational signal which is coupled to a first circuit module within the integrated circuit, said operational signal being normally associated with said one external pin, and said gating circuit having a third terminal coupled to a first test signal that is normally only internal to said integrated circuit, said first test signal being coupled to a second circuit module within the integrated circuit, said gating circuit having a fourth terminal coupled to a second test signal that is also normally only internal to said integrated circuit, said second test signal being coupled to a third circuit module within the integrated circuit, said first terminal being selectively coupled to one of said second, third and fourth terminals under control of the first and second gating control inputs;
   f) coupling the operational signal to said one external pin when the test mode enable signal is in a first state and selectively coupling one of the first and second test signals to said one external pin in response to the test selection signal when the test mode enable signal is in a second state.

* * * * *

UNITED STATES PATENT AND TRADEMARK OFFICE
CERTIFICATE OF CORRECTION

PATENT NO.    :   5,369,643
DATED         :   November 29, 1994
INVENTOR(S)   :   Rastgar et al.

It is certified that error appears in the above-identified patent and that said Letters Patent is hereby corrected as shown below:

In column 4 at line 14 delete "TMEKW#" and insert --TMEMW#--

In column 5 at line 19-20 delete "signal which is normally only mally" and insert --operational signal being normally"

In column 6 at line 13 insert --said-- following "to" and prior to "one"

Signed and Sealed this

Eleventh Day of February, 1997

Attest:

BRUCE LEHMAN

Attesting Officer

Commissioner of Patents and Trademarks